(12) United States Patent
Pourchet et al.

(10) Patent No.: US 10,070,568 B2
(45) Date of Patent: Sep. 4, 2018

(54) METHOD AND APPARATUS FOR USE IN THE MANUFACTURE OF A DISPLAY ELEMENT

(71) Applicant: Oculus VR, LLC, Menlo Park, CA (US)

(72) Inventors: Allan Pourchet, Cork (IE); William Padraic Henry, Cork (IE); Patrick Joseph Hughes, Cork (IE); Joseph O'Keeffe, Fermoy (IE)

(73) Assignee: Oculus VR, LLC, Menlo Park, CA (US)

( * ) Notice: Subject to any disclaimer, the term of this patent is extended or adjusted under 35 U.S.C. 154(b) by 5 days.

(21) Appl. No.: 15/349,760

(22) Filed: Nov. 11, 2016

(65) Prior Publication Data
US 2017/0142874 A1     May 18, 2017

(30) Foreign Application Priority Data

Nov. 13, 2015 (GB) .................................. 1520072.8

(51) Int. Cl.
*H05K 13/04* (2006.01)
*H01L 21/78* (2006.01)
*H01L 21/683* (2006.01)
*H01L 27/15* (2006.01)
*H01L 21/44* (2006.01)
(Continued)

(52) U.S. Cl.
CPC ..... *H05K 13/0404* (2013.01); *H01L 21/6836* (2013.01); *H01L 21/78* (2013.01); *H01L 27/15* (2013.01); *H01L 2221/68322* (2013.01); *H01L 2221/68368* (2013.01); *H01L 2221/68381* (2013.01)

(58) Field of Classification Search
CPC ..... H01L 21/6836; H01L 21/78; H01L 27/15; H01L 24/00; H05K 13/0404
See application file for complete search history.

(56) References Cited

U.S. PATENT DOCUMENTS 7,518,149 B2    4/2009   Maaskant et al.
2005/0176169 A1  8/2005   Koizumi et al.
(Continued)

FOREIGN PATENT DOCUMENTS

WO    WO 2004/097947 A2   11/2004
WO    WO 2011/016607 A1    2/2011

OTHER PUBLICATIONS

PCT International Search Report and Written Opinion, PCT Application No. PCT/US2016/061645, dated Feb. 16, 2017, 13 pages.

*Primary Examiner* — Brian Turner
(74) *Attorney, Agent, or Firm* — Fenwick & West LLP

(57) ABSTRACT

Methods and apparatus for use in the manufacture of a display element. Some embodiments include a method for selective pick up of a subset of a plurality of electronic devices adhered to a handle layer. The method comprises modifying a level of adhesion between one or more electronic devices of the plurality of electronic devices adhered to the handle layer, such that the subset of the plurality of electronic devices has a level of adhesion to the handle layer that is less than a force applied by a pick up tool, PUT. This enables selective pick up of the subset of the plurality of electronic devices from the handle layer by the PUT.

19 Claims, 5 Drawing Sheets

(51) Int. Cl.
*H01L 21/46* (2006.01)
*G09F 9/33* (2006.01)

(56) References Cited

U.S. PATENT DOCUMENTS

| | | | |
|---|---|---|---|
| 2005/0233546 A1* | 10/2005 | Oohata | G09F 9/33 |
| | | | 438/458 |
| 2006/0113638 A1 | 6/2006 | Maaskant et al. | |
| 2008/0122119 A1* | 5/2008 | Kian | H01L 21/6835 |
| | | | 257/783 |
| 2009/0311849 A1 | 12/2009 | Andry et al. | |
| 2011/0039067 A1* | 2/2011 | Seth | H04L 12/40006 |
| | | | 428/141 |
| 2012/0126846 A1* | 5/2012 | Jong | G01R 31/318555 |
| | | | 324/762.03 |
| 2013/0210194 A1* | 8/2013 | Bibl | H01L 24/83 |
| | | | 438/107 |
| 2013/0285086 A1* | 10/2013 | Hu | H01L 27/156 |
| | | | 257/98 |
| 2013/0309792 A1* | 11/2013 | Tischler | H01L 33/0079 |
| | | | 438/28 |
| 2014/0103372 A1 | 4/2014 | Tseng et al. | |
| 2014/0264962 A1* | 9/2014 | Gibson | H01L 23/544 |
| | | | 257/797 |
| 2015/0284603 A1* | 10/2015 | Iwai | H01L 21/6835 |
| | | | 438/694 |

\* cited by examiner

Image of single pixel beam

LEDs on UV tape

UV irradiation of
selected LEDs

LEDs picking with PUT

METHOD AND APPARATUS FOR USE IN THE MANUFACTURE OF A DISPLAY ELEMENT

CROSS REFERENCE TO RELATED APPLICATIONS

This application claims priority to United Kingdom Patent Application No. 1520072.8 filed on Nov. 13, 2015, which is incorporated by reference in its entirety.

TECHNICAL FIELD

The invention relates to methods and apparatus for use in the manufacture of a display element. The invention finds particular application in enabling selective picking of LED dies from a handle layer.

BACKGROUND

Displays are ubiquitous and are a core component of many wearable electronic devices, smart phones, tablets, laptops, desktops, TVs and display systems. Common display technologies today range from Liquid Crystal Displays (LCD's) to more recent Organic Light Emitting Diode Displays (OLEDs).

Display architectures include passive and active matrix displays depending on whether each pixel is driven separately or not. Active drive circuitry uses thin film transistor (TFT) technology where transistors based on amphorous, oxide or polysilicon technology are manufactured on glass panels which may have glass substrate sizes from the 1st generation of 30 cm×40 cm to the 10th generation (known as GEN10) of 2.88 m×3.15 m.

However, in most portable devices (i.e. battery powered devices) the display uses the majority of the available battery power. Additionally, the most common user issue for portable devices is insufficient display brightness. To extend battery life and improve brightness levels, it is may be desirable to reduce power consumption and produce higher luminance emission from the light source.

Inorganic light-emitting diode (ILED) displays are emerging as the next generation of flat display image generators providing superior battery performance and enhanced brightness. The ILED display is, at a basic level, a variation of the organic light-emitting diode (OLED) display. OLEDs pass current through organic or polymer materials that are sandwiched between two glass planes to produce light. ILEDs replace the organic LED material with a discrete standard LED (which is made of inorganic materials) at each pixel of the display (each pixel consists of three individual Red, Green and Blue LEDs for color displays).

Standard (i.e. inorganic) LED devices have been around for many years and their performance (efficiency, brightness, reliability and lifetime) has been optimized over many years as the LED industry has pursued many commercial opportunities—especially the challenge of developing LED technology to enable it to replace the standard incandescent bulbs for general light applications, i.e. inorganic LEDs are significantly more efficient, bright and reliable than the new and less developed OLED materials.

The concept of individually switchable standard LEDs (R, G & B) at each pixel in a display is well known. This approach is in widespread use for large information displays. However, to-date it has not been possible to scale this approach down to smaller displays as standard LEDs are typically planar chips which are inefficient for light direction control. Additionally, the assembly of the many millions of pixels needed for a laptop or smart phone display is not feasible using standard assembly manufacturing techniques.

SUMMARY

Disclosed herein is a manufacturing assembly method for ILED displays, i.e. assembling millions of inorganic LED dies in a matrix array to produce an LED display.

Exemplary embodiments relate to a method of patterning a handle layer in order to selectively release dies for picking, and to enable a selectable pick up tool (PUT) to be used in a micro-assembly.

The handle layer may be UV tape. The UV tape is selectively irradiated (patterned) with a UV light only below the LEDs (this is termed a corresponding section of the handle layer, in that it corresponds to the location of an LED device) which need to be picked. The adhesion between these LEDs and the tape is decreased, which allows a picking of the selected chips by a PUT during the pick action of a micro-assembly pick and place cycle.

The UV light can be from any UV source that can be used for patterning, such as UV laser, UV LED Array or UV light and mask.

Other handle layers such as thermal release tape, multiple layer tape or any adhesion switchable layer can be alternatively used.

This method enables the selective: removal of known bad dies from a wafer/handle layer or substrate, picking of dies for the placement of only known good die during the transfer print operation, or picking of a reduced subset of the full LED array on a PUT during a transfer print cycle.

Alternatively, the irradiated patterned treatment of the handle layer can enhance rather than reduce the adhesion of specific die to the handle layer in order to manage and control the picking of die.

Some embodiments include a method for selective pick up of a subset of a plurality of electronic devices adhered to a handle layer. The method comprises modifying a level of adhesion between a subset of electronic devices of the plurality of electronic devices adhered to the handle layer such that the subset of electronic devices has a modified level of adhesion to the handle layer; and separating, by a pick up tool (PUT), the subset of electronic devices from the handle layer by applying a force to the subset of electronic devices that is greater than the modified level of adhesion of the subset of electronic devices to the handle layer.

A second subset of electronic devices is adhered to the handle layer with the level of adhesion that is greater than the force applied by the PUT. The force does not separate the second set subset of electronic devices from the handle layer when the subset of electronic devices is separated from the handle layer. As such, the subset of electronic devices is selectively separated from the handle layer while the second subsequent of electronic devices remain adhered to the handle layer.

Modifying the level of adhesion may include reducing the level of adhesion of the subset of electronic devices with the handle layer.

The PUT may apply the force to the subset of electronic devices by adhesion. The method may further comprise contacting the PUT with the subset of electronic devices.

The PUT may be a non-selective PUT.

Modifying the level of adhesion between the subset of electronic devices and the handle layer may comprise heating the subset of electronic devices and/or corresponding portions of the handle layer where the subset of electronic devices are adhered.

Modifying the level of adhesion between the subset of electronic devices and the handle layer may comprise applying a liquid stimulus to the subset of electronic devices and/or the corresponding portions of the handle layer where the subset of electronic devices are adhered.

Modifying the level of adhesion between the subset of electronic devices and the handle layer may include controlling adhesion of microstructures of the handle layer.

Modifying the level of adhesion between the subset of electronic devices and the handle layer may comprise irradiating with light corresponding portions of the handle layer where the subset of electronic devices are adhered.

The light may comprise ultraviolet (UV) light.

The UV light may originate from one or more of: a UV laser; a UV LED array; or a UV light source passed through a photolithography mask.

The method may further include, subsequent to separating the subset of electronic devices from the handle layer: modifying the level of adhesion between the second subset of electronic devices adhered to the handle layer such that the second subset electronic devices has the modified level of adhesion to the handle layer; and separating, by the PUT, the second subset of electronic devices from the handle layer by applying the force to the second subset of electronic devices that is greater than the modified level of adhesion of the second subset of electronic devices to the handle layer.

The method may further include transferring, by the PUT, the subset of electronic devices to a substrate at locations where defective electronic devices were removed from the substrate.

The method may further include manufacturing the electronic devices on a wafer; singulating the electronic devices on the wafer; and adhering the singulated electronic devices to the handle layer.

The electronic devices adhered to the handle layer may comprise light emitting diode (LED) devices.

The electronic devices adhered to the handle layer may comprise inorganic LED devices.

The electronic devices adhered to the handle layer may comprise micro-LED (μLED) devices, each μLED device comprising a μLED emitter including: a substantially parabolic mesa structure; a light emitting source within the mesa structure; and a primary emission surface on a side of the μLED device opposed to a top of the mesa structure.

The handle layer may comprise any one of: a semiconductor wafer; a UV tape; a thermal release tape; a multiple layer tape; or an adhesion adjustable layer.

The method may further comprise transferring, using the PUT, the subset of electronic devices to a substrate of a display element.

Some embodiments may include a non-transitory computer readable storage media including a computer program comprising instructions which, when executed by at least one processor, configures the at least one processor to perform the methods discussed herein

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Generally disclosed herein is a way of achieving a selectable pick up tool (PUT) for micro-assembly.

μLED technology in this invention refers to micron size ILED devices which directionalize the light output and maximize the brightness level observed by the user. The μLED as disclosed in U.S. Pat. No. 7,518,149 is a next generation LED technology developed specifically to deliver directionalized light, i.e. only to where it is required.

Figure 1:
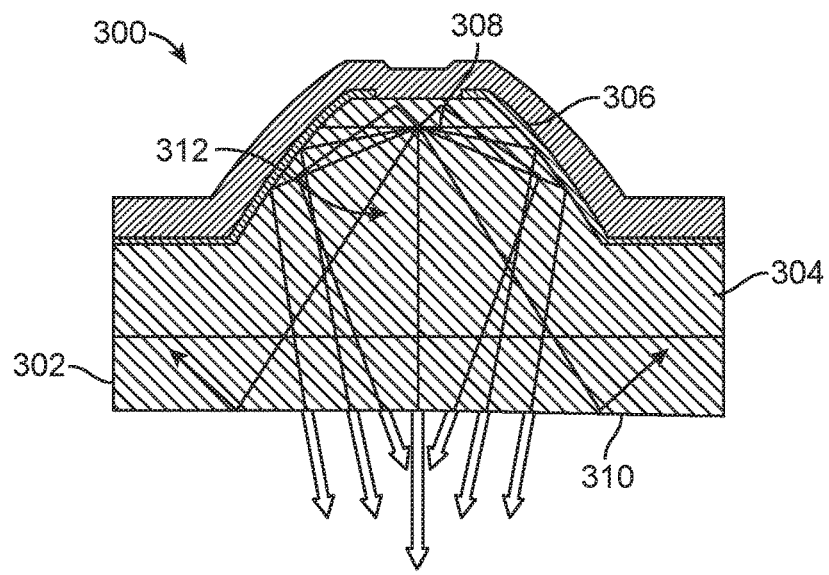
FIG. 1 illustrates a schematic of a μLED device, in accordance with one embodiment.
Figure 2:
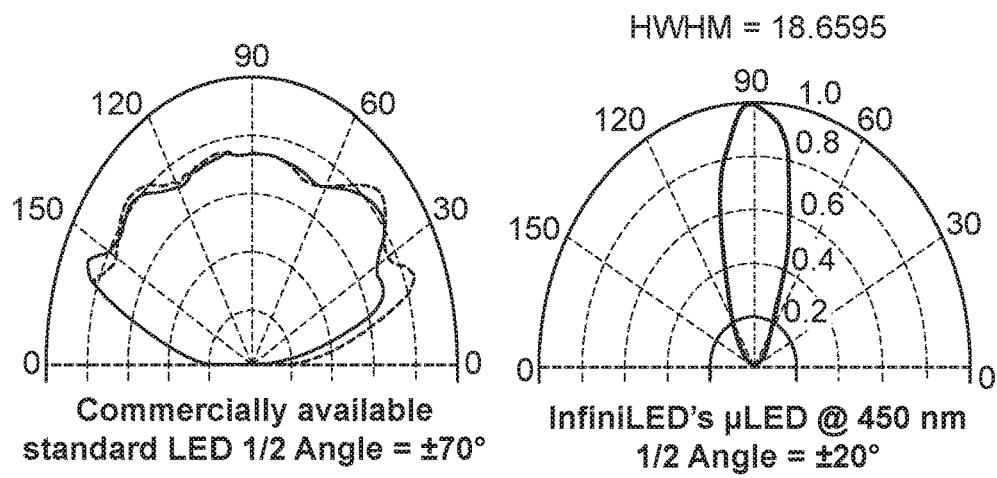
FIG. 2 illustrates a beam profile output from a commercial planar LED device, a beam profile output from a μLED device and an image of a single pixel beam, in accordance with one embodiment.
Figure 2:
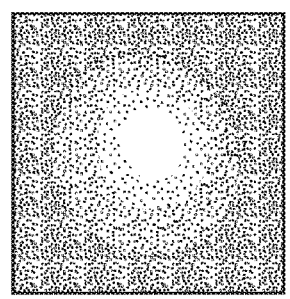

The μLED is typically <20 μm in diameter with a parabolic structure etched directly onto the LED die during the wafer processing steps to form a quasi-collimated light beam emerging from the chip (as shown in FIG. 2, FIG. 1). The micro ILED emitters include a micro ILED structure similar to that proposed in International Application Publication No. WO 2004/097947 (or U.S. Pat. No. 7,518,149) with a high extraction efficiency and outputting quasi-collimated light because of its shape. A micro ILED 300 is shown in FIG. 1, wherein a substrate 302 has a semiconductor epitaxial layer 304 located on it. The epitaxial layer 104 is shaped into a mesa 306. An active (or light emitting) layer 308 is enclosed in the mesa structure 306. The mesa 306 has a truncated top, on a side opposed to a light transmitting or emitting face 310. The mesa 306 also has a near-parabolic shape to form a reflective enclosure for light generated or detected within the device. The arrows 312 show how light emitted from the active layer 308 is reflected off the walls of the mesa 306 toward the light exiting surface 310 at an angle sufficient for it to escape the LED device 300 (i.e. within the angle of total internal reflection). The electrical contact pads of the device are not shown in FIG. 1 but are located on the opposite surface to the emitting face 310.

This shaped structure results in a significant increase in the efficiency into low illumination angles when compared to unshaped or standard LED chips, see FIG. 2. This increased efficiency and collimated output of the μLED is such that it can produce light visible to the human eye with only nano-amps of drive current.

Figure 3:
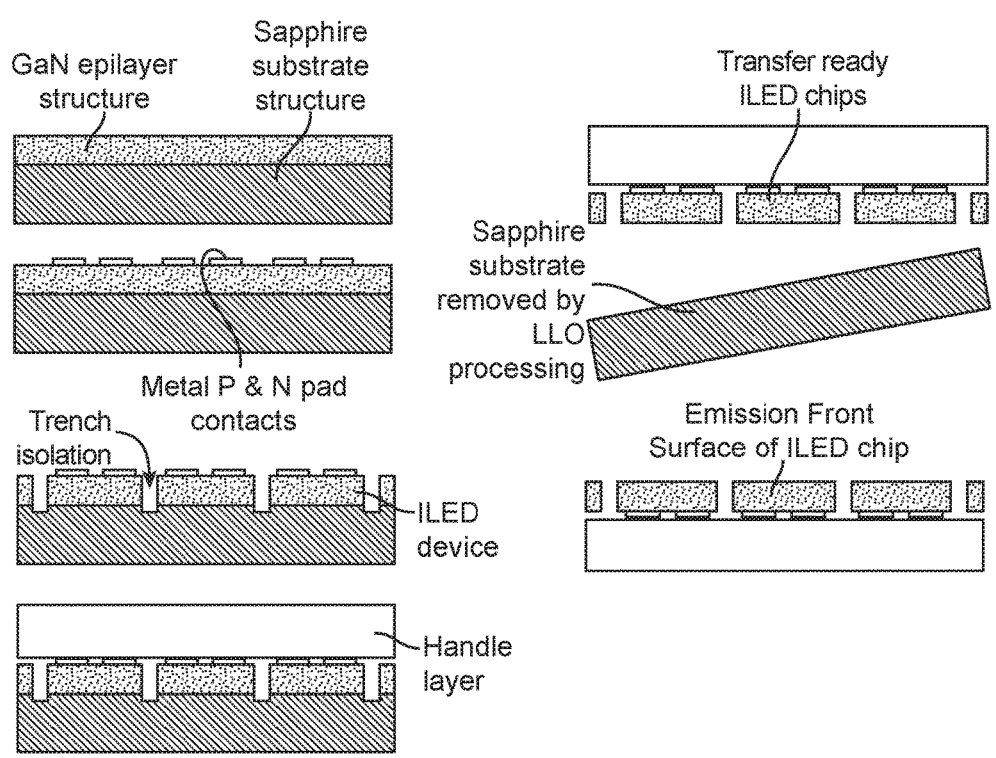
FIG. 3 illustrates schematically an overview of an μLED assembly process flow, in accordance with one embodiment.
Figure 4A:
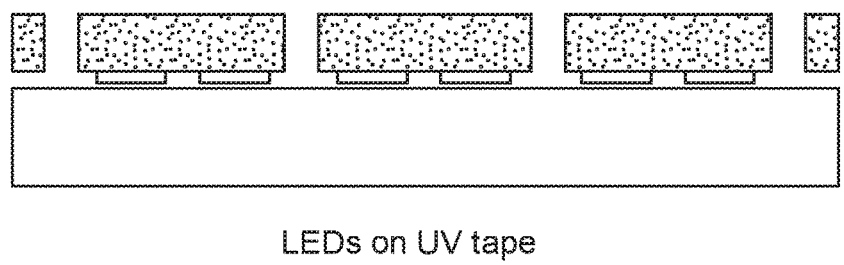
FIGS. 4A-4E illustrates schematically an overview of an exemplary "pick and place" process, in accordance with one embodiment.
Figure 4B:
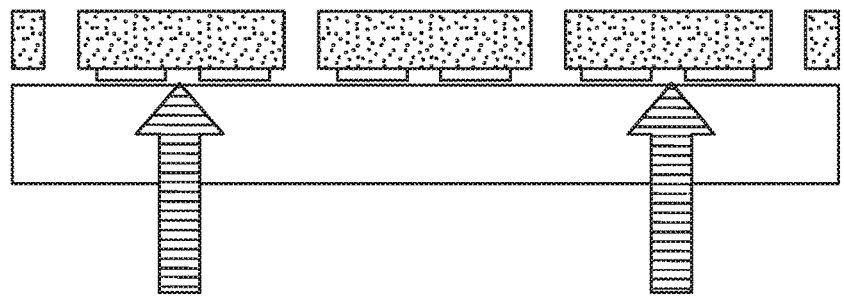
Figure 4C:
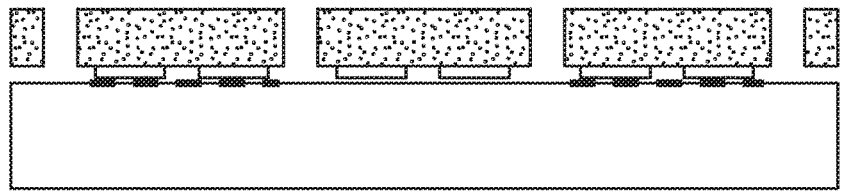
Figure 4D:
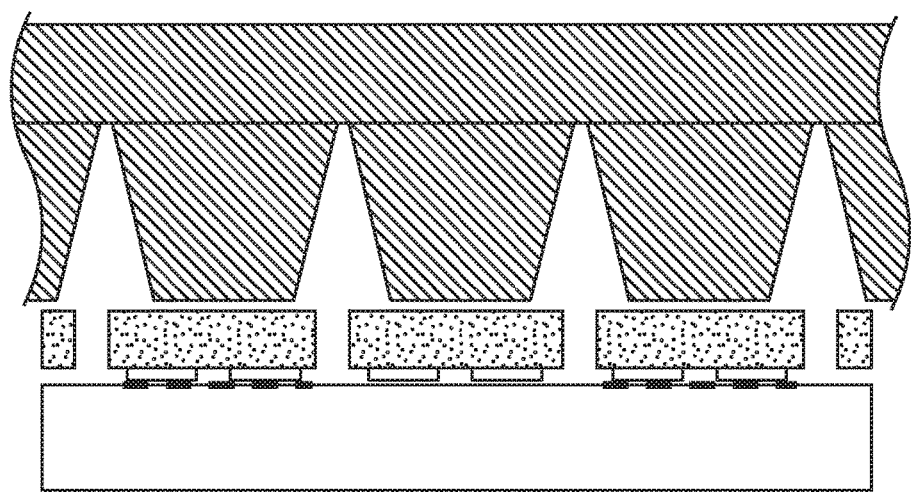
Figure 4E:
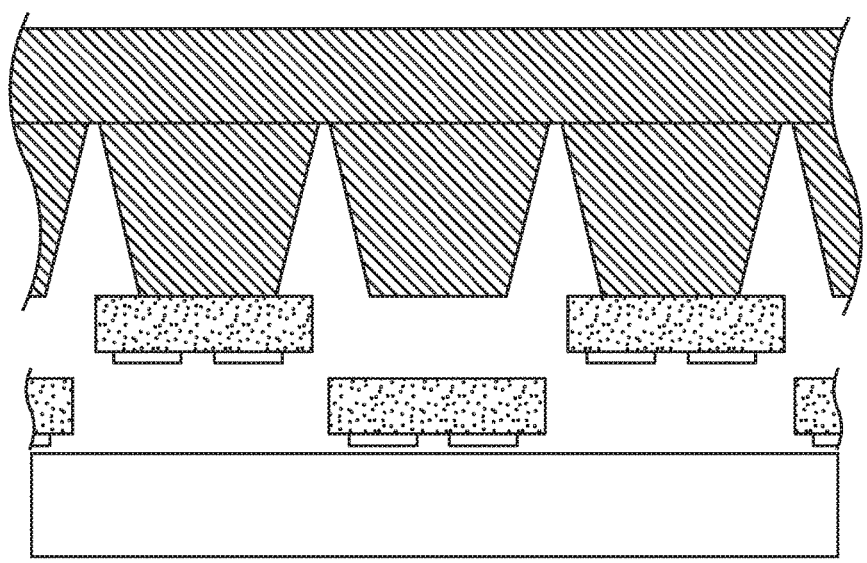

A "μAssembly ready" process flow is disclosed in FIG. 3, based on GaN on sapphire material system for blue and green emitting μLEDs. It should be appreciated that this invention is not restricted to this material system nor the sequence of process flow proposed in this disclosure.

The process starts with a GaN on sapphire wafer with epi-layer and/or template plus the substrate which is tailored for ILED chip manufacture and assembly readiness.

An initial step in the process is the manufacture of the μLED device and together with p and n contact pads. After μLED fabrication the chips are partially singulated on the wafer by a combination of photolithography to define a hard mask and dry etch methods (e.g. deep reactive-ion etching (DRIE) or inductively coupled plasma (ICP) etch tools) which etches a typical 2 μm wide, 3-5 μm deep trench in the GaN epilayer/template between neighboring devices. As an example, a SiOx hard mask is deposited and patterned using deep UV resist & photolithography tools to transfer the defined pattern into the SiOx using CF4/CHF3 ICP etch chemistry. This is followed by a second chlorine based etch chemistry to etch the GaN. The hard mask is left on the devices for isolation purposes.

After the partial singulation, a mechanical (or handle) layer (i.e., tape) is applied to the top surface which acts as a handle layer for subsequent processing steps. Once the handle layer is applied, a laser lift-off process is applied which removes the sapphire substrate using a laser beam. Laser lift-off processing is a technique to detach the sapphire substrate from the GaN epilayers using excimer laser photons. The technology is of interest for high throughput and superior quality in the manufacture of HB-LEDs (high brightness) and flexible displays.

Once the sapphire substrate is detached the structure is ready for assembly. Assembly may be undertaken using pick and place techniques and the modification of the adherence of each electronic device to the handle layer, as disclosed herein.

A manufacturing process is disclosed herein which addresses the assembly of semiconductor chips to form an electrical circuit. One embodiment can be an ILED image generator for display products.

It is therefore an objective of the methods and apparatus disclosed to provide an image generator and associated method of manufacture using a plurality of ILED chips which are especially designed to enable their contact and conformance to a pick up tool (PUT) for handling and manipulation onto a glass panel which may include thin film transistor (TFT) circuitry.

Specifically, disclosed herein is a method that enables the selective picking of ILED die (devices) from a handle layer using a pick up tool (PUT) by manipulating the adhesion properties of the handle layer on which the dies are mounted. This method is particularly suited to situations where micro-assembly is used to transfer LED dies from a wafer or alternative substrate (the handle layer) to a glass panel or similar substrate.

The handle layer adhesion is sensitized and adapted selectively and locally by an external stimulus. This stimulus can for example be light activated, thermally activated, liquid activated or alternatively by structuring the handle layer with microstructures which control the adhesion properties of the handle layer. The stimulus may applied to the specific die that are to be picked by the PUT (or alternatively to the die that are not to be picked up by the PUT) prior to the PUT coming in contact with the LED wafer during the pick action of the transfer cycle.

This method facilitates the selective pick of known good die as a result of defect or parametric failures from the handle wafer, or alternatively picking a subset of a full array of ILED die if the subset is used to complete the assembly of the full image generator. The method can also be applied to pick bad die from a wafer or substrate as part of a repair or replacement cycle.

Normally a PUT, structured to pick up a 2D array of dies, will pick a die in all locations on contacting the source of the dies (that may be located on a wafer or alternative substrate) due to the pick forces applied by the PUT. In designing such a system, one has to ensure that the pick forces of the PUT exceed the adhesiveness between the LED die and the handle wafer/substrate. However, in this basic situation it is not possible to selectively change the equilibrium of these forces to enable some specified die to remain unpicked. The methods and apparatus disclosed herein enable such a selection. This is achieved by modifying the adhesiveness between the LED die and the handle wafer/substrate prior to the pick action to ensure only some dies (the selected ones) have an adhesiveness force (level of adhesion) less than pick forces provided by the PUT—ensuring that these dies are picked. A similar method can be used to selectively remove known bad dies from a substrate.

In order to build a display, a first set of ILEDs is picked from the handle layer with a PUT and placed on glass panel (optionally containing TFT circuits to control the ILEDs). That sequence is repeated with a second set of LEDs, and subsequently, until the display is fully populated. Each set of LEDs can consist of thousands of LEDs.

The success of the picking and placing steps is based on the control of the adhesion cascade between the different steps of the process.

Indeed, for a successful picking of an LED by the PUT, the adhesion PUT/LED must be stronger than the adhesion LED/handle. Similarly, for a successful placing of an LED, the adhesion receiving substrate/LED must be stronger than the adhesion PUT/LED. Alternatively, the PUT/LED adhesion during the placement cycle may be switched on and off.

Some embodiments include a method of patterning a LED handle layer in areas corresponding to particular LEDs in order to control its adhesion and selectively release the selected LEDs for picking.

Initially the adhesion LED/handle is stronger than the adhesion PUT/LED. The adhesion LED/handle under a selected LED is selectively decreased such that it becomes smaller than the adhesion PUT/LED. In that case, the selected LEDs are picked by the PUT while the others stay on the handle layer.

The handle layer is, in an exemplary arrangement, UV tape. This UV tape is irradiated with patterned UV light only below the LEDs which need to be picked. The adhesion between these LEDs and the tape is decreased which allows a picking of the chips by the PUT.

The UV light can be from any UV source that can be used for patterning: Examples may include UV laser or UV µLED Array (maskless photolithography) or standard UV light source shined through a standard photolithography mask.

An overview of the overall pick and place process in the case of UV tape is given in FIGS. 4A-4E.

Other handle layers can be used instead of UV tape. Some examples are given below: —a thermal release tape: the area below the selected LED is heated via a laser or any selective heat source; multiple layer tape: the layer(s) underneath the selected LEDs are vaporized by a laser or any selective vaporizing source; or a substrate covered with an adhesion switchable layer (UV glue, wax, etc.)

The PUT can be of any type and material that meets the adhesion parameters. UV tape can even be used as a PUT. Here, the adhesion PUT/LED can be decreased by UV irradiation after the picking step, which makes the placing easier. A fresh UV tape is used for every pick and place sequence.

On a commercial ILED display, all LEDs should be functional. In a typical LED manufacturing environment all LEDs on a wafer are tested. This is generally achieved by using specialist LED testing equipment that makes electrical contact with the P & N contacts of each LED on the wafer. However, when LEDs are manufactured for ILED displays, the LED die is many orders of magnitude smaller than those produced for other lighting applications. There may be 100 million separate LED dies on a 4" wafer. This makes it difficult if not impossible to test each die and to create a known good die (KGD) map.

One use of a selectable pick-up method, such as those disclosed herein, enables a manufacturing flow that provides for the production of high yielding ILED displays using a selectable PUT using untested LED wafers. In such a flow, the PUT picks a LED in every location during a first pick and place cycle. The LEDs are then tested in a glass panel. A second pick and place cycle will pick LEDs only on the PUT locations that match the locations on the glass panel where defective or missing LEDs were detected during the test cycle. This selectable picking is enabled by the proposed methods and apparatus. Multiple such additional pick and place cycles can be used to ensure that a working LED is located at each location (100% working display pixels) on the glass substrate using the selectable pick-up methods outlined herein, i.e. whereby a non-selectable PUT only picks LEDs in the locations on the PUT to match the locations on the glass panel were defective or missing LEDs were detected during the last test cycle.

Another use of the proposed selectable pick-up methods relates to a situation where a KGD map is available for a LED wafer, such as after an appropriate test methodology is used to create the KGD map. This is a modification to the process described above. The selectable pick-up methods can be used to eliminate/prevent the pick-up of defective die during the pick and place cycle thereby ensuring that no bad die are placed onto the glass substrate. The subsequent pick and place cycles described above will backfill any locations on the glass substrate that did not receive a LED in a previous pick and place cycle for this reason.

Another use of the proposed selectable pick-up methods is to 'repair' an LED wafer before using it for the above proposed ILED display manufacturing process. A selectable pick-up method could be used to selectably remove (and dump) an array of defective LEDs from a wafer or the handle layer. Replacement die can then be picked from another wafer and put into the first wafer locations in which the bad die were removed. Multiple such replacement cycles may be required to backfill all the positions from which defective dies were removed. This approach will create a LED wafer/handle layer with a 100% LED yield. Such a wafer/handle layer as the input to the above described manufacturing process will produce 100% yielding ILED displays.

A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to perform some or all of the method.

Various methods and apparatus are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, the invention may be embodied in hardware and/or in software (including firmware, resident software, micro-code, etc.) that runs on a processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method for selective pick up of a subset of electronic devices adhered to a handle layer, the method comprising:
    modifying a level of adhesion between the a subset of electronic devices and the handle layer such that the subset electronic devices has a modified level of adhesion to the handle layer, wherein:
    the electronic devices adhered to the handle layer comprise light emitting diode (LED) devices each including a first side adhered to the handle layer and a second side opposite the first,
    the electronic devices adhered to the handle layer include the subset of electronic devices and a second subset of electronic devices, and
    modifying the level of adhesion between the subset of electronic devices and the handle layer comprises applying a liquid stimulus to the subset of electronic devices and/or corresponding portions of the handle layer where the subset of electronic devices are adhered; and
    separating, by a pick up tool (PUT), the subset of electronic devices from the handle layer by applying a force to second sides of the subset of electronic devices that is greater than the modified level of adhesion of the subset of electronic devices to the handle layer.

2. The method of claim 1, wherein modifying the level of adhesion between the subset of electronic devices and the handle layer includes reducing the level of adhesion.

3. The method of claim 1, wherein the PUT applies the force to the subset of electronic devices by adhesion, the method further comprising contacting the PUT with the subset of electronic devices.

4. The method of claim 1, wherein the PUT is a non-selective PUT.

5. The method of claim 1, wherein modifying the level of adhesion between the subset of electronic devices and the handle layer comprises heating the subset of electronic devices and/or corresponding portions of the handle layer where the subset of electronic devices are adhered.

6. The method of claim 1, wherein modifying the level of adhesion between the subset of electronic devices and the handle layer comprises irradiating with light corresponding portions of the handle layer where the subset of electronic devices are adhered.

7. The method of claim 6, wherein the light comprises ultraviolet (UV) light.

8. The method of claim 7, wherein the UV light originates from one or more of:
    a UV laser;
    a UV LED array; or
    a UV light source passed through a photolithography mask.

9. The method of claim 1, wherein the LED devices are inorganic LED devices.

10. The method of claim 1, wherein the LED devices are micro-LED (μLED) devices, each μLED device including a μLED emitter comprising:
    a substantially parabolic mesa structure;
    a light emitting source within the mesa structure to emit light, the light from the light emitting source being reflected at the substantially parabolic mesa structure toward a primary emission surface; and
    the primary emission surface on the second side of the μLED device opposed to a top of the mesa structure at the first side.

11. The method of claim 1, wherein the handle layer comprises one of: a semiconductor wafer; a UV tape; a thermal release tape; a multiple layer tape; or an adhesion adjustable layer.

12. The method of claim 1, further comprising:
    transferring, by the PUT, the subset of electronic devices to a substrate of a display element.

13. The method of claim 1, wherein modifying the level of adhesion between the subset of electronic devices and the handle layer includes controlling adhesion of the handle layer.

14. The method of claim 1, wherein:
    the second subset of electronic devices is adhered to the handle layer with the level of adhesion that is greater than the force applied by the PUT; and
    the force does not separate the second subset of electronic devices from the handle layer when the subset of electronic devices is separated from the handle layer.

15. The method of claim 1, further comprising, subsequent to separating the subset of electronic devices from the handle layer:
    modifying the level of adhesion between the second subset of electronic devices adhered to the handle layer such that the second subset electronic devices has the modified level of adhesion to the handle layer; and
    separating, by the PUT, second the subset of electronic devices from the handle layer by applying the force to the second subset of electronic devices that is greater than the modified level of adhesion of the second subset of electronic devices to the handle layer.

16. The method of claim 1, further comprising transferring, by the PUT, the subset of electronic devices to a substrate at locations where defective electronic devices were removed from the substrate.

17. The method of claim 1, further comprising:
    manufacturing the electronic devices on a wafer;
    singulating the electronic devices on the wafer; and
    adhering the singulated electronic devices to the handle layer.

18. A non-transitory computer readable media storing computer program comprising instructions, the computer program instructions when executed by at least one processor, configure the at least one processor to:
    modify a level of adhesion between a subset of electronic devices and the handle layer such that the subset electronic devices has a modified level of adhesion to the handle layer, wherein:
    the electronic devices adhered to the handle layer comprise light emitting diode (LED) devices each including a first side adhered to the handle layer and a second side opposite the first side,
    the electronic devices adhered to the handle layer include the subset of electronic devices and a second subset of electronic devices, and
    modifying the level of adhesion between the subset of electronic devices and the handle layer comprises applying a liquid stimulus to the subset of electronic devices and/or corresponding portions of the handle layer where the subset of electronic devices are adhered; and
    separate, by controlling a pick up tool (PUT), the subset of electronic devices from the handle layer by applying a force to second sides of the subset of electronic devices that is greater than the modified level of adhesion of the subset of electronic devices to the handle layer.

19. A system for selective pick up of electronic devices adhered to a handle layer, comprising:
circuitry configured to:
modify a level of adhesion between a subset of electronic devices and the handle layer such that the subset electronic devices has a modified level of adhesion to the handle layer, wherein:
the electronic devices adhered to the handle layer comprise light emitting diode (LED) devices each including a first side adhered to the handle layer and a second side opposite the first side,
the electronic devices adhered to the handle layer include the subset of electronic devices and a second subset of electronic devices, and
modifying the level of adhesion between the subset of electronic devices and the handle layer comprises applying a liquid stimulus to the subset of electronic devices and/or corresponding portions of the handle layer where the subset of electronic devices are adhered; and
separate, by a pick up tool (PUT), the subset of electronic devices from the handle layer by applying a force to second sides of the subset of electronic devices that is greater than the modified level of adhesion of the subset of electronic devices to the handle layer.

* * * * *

UNITED STATES PATENT AND TRADEMARK OFFICE
CERTIFICATE OF CORRECTION

PATENT NO. : 10,070,568 B2
APPLICATION NO. : 15/349760
DATED : September 4, 2018
INVENTOR(S) : Allan Pourchet et al.

It is certified that error appears in the above-identified patent and that said Letters Patent is hereby corrected as shown below:

In the Claims

Column 9, Line 8, In Claim 1, before "subset", delete "a"

Signed and Sealed this
Fourteenth Day of May, 2019

Andrei Iancu
*Director of the United States Patent and Trademark Office*